US009869736B2

(12) United States Patent
Zhao

(10) Patent No.: US 9,869,736 B2
(45) Date of Patent: Jan. 16, 2018

(54) WATER/FAT IMAGE IDENTIFICATION METHOD AND DEVICE, AND HARMONIZATION METHOD AND DEVICE

(71) Applicant: SIEMENS AKTIENGESELLSCHAFT, Munich (DE)

(72) Inventor: Cong Zhao, Shenzhen (CN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 1160 days.

(21) Appl. No.: 13/871,058

(22) Filed: Apr. 26, 2013

(65) Prior Publication Data
US 2013/0285658 A1    Oct. 31, 2013

(30) Foreign Application Priority Data

Apr. 27, 2012    (CN) .......................... 2012 1 0128266

(51) Int. Cl.
G01R 33/48    (2006.01)
(52) U.S. Cl.
CPC ................. *G01R 33/4828* (2013.01)
(58) Field of Classification Search
CPC .................................. G01R 33/4828
See application file for complete search history.

(56) References Cited

U.S. PATENT DOCUMENTS 5,909,119 A    6/1999  Zhang et al.
8,805,046 B2 *  8/2014  Dai .................. G01R 33/3873
                                                    324/312

2001/0010810 A1  8/2001  Miyoshi
2005/0030025 A1  2/2005  Ma et al.
2010/0239149 A1  9/2010  Wang et al.
(Continued)

FOREIGN PATENT DOCUMENTS

CN    1279052 A    1/2001
CN    1425355 A    6/2003
CN    1560069 A    1/2005
(Continued)

OTHER PUBLICATIONS

Office Action for corresponding Chinese Application No. 201210128266.5 dated Sep. 30, 2014.
(Continued)

*Primary Examiner* — Dixomara Vargas
(74) *Attorney, Agent, or Firm* — Harness, Dickey & Pierce, P.L.C.

(57) ABSTRACT

Example embodiments relate to a water/fat image identification method and device including obtaining a water/fat image pair calculated by a Dixon method, and marking these as a first image and a second image; calculating grayscale histograms for the first image and the second image, respectively, to obtain a first grayscale histogram and second grayscale histogram; subtracting the second grayscale histogram from the first grayscale histogram to obtain a water/fat relationship graph; searching for the highest peak and lowest trough in the water/fat relationship graph, and if the highest peak is located behind the lowest trough, determining the first image as being a water image and the second image as being a fat image; and otherwise, determining the opposite.

16 Claims, 7 Drawing Sheets

(56) References Cited

U.S. PATENT DOCUMENTS

2011/0254547 A1  10/2011  Reeder et al.
2012/0301007 A1  11/2012  Shirai et al.

FOREIGN PATENT DOCUMENTS

| CN | 1827038 | A | 9/2006 |
| CN | 101843483 | A | 9/2010 |
| JP | H0265840 | A | 3/1990 |
| JP | 2001204711 | A | 7/2001 |
| JP | H09164125 | A | 7/2001 |
| JP | 2010051335 | A | 3/2010 |
| KR | 20030029028 | A | 4/2003 |
| WO | WO 2011108314 | A1 | 9/2011 |

OTHER PUBLICATIONS

Office Action for corresponding Korean Application No. 10-2013-0047360 dated Dec. 1, 2015.

Romu T. et al.: "Fat water classification of symmetrically sampled two-point Dixon images using biased partial vol. effects"; Proc. Intl. Soc. Mag. Reson. Med; vol. 19; p. 2711; 2011.

* cited by examiner

WATER/FAT IMAGE IDENTIFICATION METHOD AND DEVICE, AND HARMONIZATION METHOD AND DEVICE

PRIORITY STATEMENT

The present application hereby claims priority under 35 U.S.C. §119 to Chinese patent application number CN 201210128266.5 filed Apr. 27, 2012, the entire contents of which are hereby incorporated herein by reference.

TECHNICAL FIELD

At least one embodiment of the present invention relates to the technical field of magnetic resonance imaging, in particular to a method and device for water/fat image identification in magnetic resonance imaging, and/or a method and/or device for water/fat image harmonization in magnetic resonance imaging.

BACKGROUND

Magnetic resonance imaging (MRI) is a technology which uses the phenomenon of magnetic resonance to perform imaging. The principles of the phenomenon of magnetic resonance mainly include: in atomic nuclei containing a single proton, such as the hydrogen atom nuclei which are present throughout the human body, the protons have spin motion and as such resemble small magnets. Moreover, the spin axes of these small magnets have no definite regular pattern, and if an external magnetic field is applied, these small magnets will rearrange according to the magnetic force lines of the external magnetic field; specifically, they will rearrange in two directions, parallel or anti-parallel to the magnetic force lines of the external magnetic field. The direction parallel to the magnetic force lines of the external magnetic field is known as the positive longitudinal axis, while the direction anti-parallel to the magnetic force lines of the external magnetic field is known as the negative longitudinal axis.

The atomic nuclei only have a longitudinal magnetization component, which has both a direction and a magnitude. In magnetic resonance imaging, a radio frequency (RF) pulse of a specific frequency is used to excite the atomic nuclei in the external magnetic field, so that the spin axes of these atomic nuclei deviate from the positive longitudinal axis or negative longitudinal axis, giving rise to resonance. Once the spin axes of the above atomic nuclei have deviated from the positive longitudinal axis or negative longitudinal axis, the atomic nuclei have a transverse magnetization component.

After transmission of the RF pulse has stopped, the excited atomic nuclei emit an echo signal, releasing the absorbed energy gradually in the form of electromagnetic waves, and the phases and energy levels thereof all return to the pre-excitation state. An image can be reconstructed by subjecting the echo signal emitted by the atomic nuclei to further processing, such as spatial encoding. The process by which the above excited atomic nuclei return to the pre-excitation state is known as the relaxation process, and the time required to return to an equilibrium state is known as the relaxation time.

Since the hydrogen atomic nuclei in fat and the hydrogen atomic nuclei in water inside the human body are in different molecular environments, they have different resonance frequencies and different relaxation times when excitation is carried out using the same RF pulses. If signals are collected at different echo times, fat tissue and water display different phases and signal strengths.

Dixon methods are used to create a pure water proton image in MRI. The basic principle thereof is that two kinds of echo signals, in-phase and opposed-phase, of water and fat protons are collected separately; the two kinds of signal with different phases are subjected to an operation, each generating a pure water proton image and a pure fat proton image, thereby achieving the objective of fat suppression. There are at present many Dixon imaging methods for water/fat separation in the art, including the single-point Dixon method, two-point Dixon method and three-point Dixon method, etc.

However, with regard to any Dixon method with symmetrical acquisition (in-phase/opposed-phase acquisition), the inability to determine which is the water image and which is the fat image on the basis of the phase information thereof results in the type of water/fat image obtained by the Dixon method being unknown.

Taking the three-point Dixon method as an example, the principle thereof is to obtain an in-phase (or opposed-phase) image and two opposed-phase (or in-phase) images simultaneously, find additional phases caused by magnetic field inhomogeneity on the basis of the two opposed-phase (or in-phase) images, subject the two opposed-phase (or in-phase) images to phase correction, and then find a water image and a fat image together with the in-phase (or opposed-phase) image. In practical applications, since the additional phases found from the two opposed-phase (or in-phase) images cannot be used directly for correction of the phases thereof, the phases must be subjected to back-wrapping, while the intrinsic instability of phase back-wrapping results in the possibility of the calculated fat and water images being swapped sometimes, so that there is no way of accurately determining which is the water image and which is the fat image.

To solve this problem, Chinese patent application 201010610002.4 (inventor WENG, Dehe) discloses a method for water/fat image identification in MRI. The method includes: obtaining three echoes with no phase encoding as a reference scan; using the reference scan to calculate a reference water image projection and/or a reference fat image projection in the phase encoding direction, to obtain a reference water/fat image projection; based on a water image and fat image calculated by the three-point Dixon method, calculating a complete water image projection and/or a complete fat image projection in the phase encoding direction, to obtain a complete water/fat image projection; calculating the correlation between the reference water/fat image projection and the complete water/fat image projection, to obtain at least two correlation values; obtaining the greatest correlation value from the calculated correlation values, determining the type of the complete image projection corresponding to the greatest correlation value as the type of the reference image projection corresponding to the greatest correlation value, and determining the type of the image calculated by the three-point Dixon method on the basis of the type of the complete image projection.

In addition, those skilled in the art are still diligently searching for other solutions.

SUMMARY

At least one embodiment of the present invention provides, on the one hand, an MRI water/fat image identification method and device, for determining the precise type of a calculated water/fat image, and on the other hand, an MRI water/fat image harmonization method and device, for harmonizing the image types corresponding to different anatomical regions in a single water/fat image, to facilitate subsequent processing.

At least one embodiment of the present invention provides an MRI water/fat image identification method and device, comprising:

A: obtaining a water/fat image pair calculated by a Dixon method, and marking these as a first image and a second image;

B: calculating grayscale histograms for the first image and the second image, respectively, to obtain a first grayscale histogram and second grayscale histogram;

C: subtracting the second grayscale histogram from the first grayscale histogram to obtain a water/fat relationship graph; and D: searching for the highest peak and lowest trough in the water/fat relationship graph, and judging the positional relationship of the highest peak and the lowest trough in the water/fat relationship graph, and if the highest peak is located behind the lowest trough, determining the first image as being a water image and the second image as being a fat image; otherwise, determining the second image as being a water image and the first image as being a fat image.

According to another embodiment of the present invention, an MRI water/fat image identification method comprises:

A: obtaining a water/fat image pair calculated by a Dixon method, and marking these as a first image and a second image;

B: obtaining an in-phase image corresponding to the water/fat image pair, and using a grayscale histogram of the in-phase image to determine an image mask;

C: subjecting the image mask to image segmentation, to obtain a region image mask corresponding to each anatomical region;

D: selecting one of the region image masks as a reference region image mask;

E: using the reference region image mask to extract a first reference foreground image from the first image and a second reference foreground image from the second image;

F: calculating grayscale histograms for the first reference foreground image and the second reference foreground image, respectively, to obtain a first reference grayscale histogram and a second reference grayscale histogram;

G: subtracting the second reference grayscale histogram from the first reference grayscale histogram, to obtain a reference water/fat relationship graph;

H: selecting one of the remaining region image masks as a current region image mask;

I: using the current region image mask to extract a first current foreground image from the first image and a second current foreground image from the second image;

J: calculating grayscale histograms for the first current foreground image and the second current foreground image, respectively, to obtain a first current grayscale histogram and a second current grayscale histogram;

K: subtracting the second current grayscale histogram from the first current grayscale histogram, to obtain a current water/fat relationship graph;

L: judging whether the reference water/fat relationship graph and the current water/fat relationship graph have the same pattern characteristics, and if they do, keeping the positions of the first current foreground image and the second current foreground image unchanged; otherwise, replacing the first current foreground image and the second current foreground image;

M: judging whether there is any unprocessed region image mask remaining, and if there is, returning to step H; otherwise, performing step N; and N: searching for the highest peak and lowest trough in the reference water/fat relationship graph obtained in step G, and judging the positional relationship of the highest peak and the lowest trough in the reference water/fat relationship graph, and if the highest peak is located behind the lowest trough, determining the first image as being a water image and the second image as being a fat image; otherwise, determining the second image as being a water image and the first image as being a fat image.

According to another embodiment of the present invention, an MRI water/fat image harmonization method comprises:

A: obtaining a water/fat image pair calculated by a Dixon method, and marking these as a first image and a second image;

B: obtaining an in-phase image corresponding to the water/fat image pair, and using a grayscale histogram of the in-phase image to determine an image mask;

C: subjecting the image mask to image segmentation, to obtain a region image mask corresponding to each anatomical region;

D: selecting one of the region image masks as a reference region image mask;

E: using the reference region image mask to extract a first reference foreground image from the first image and a second reference foreground image from the second image;

F: calculating grayscale histograms for the first reference foreground image and the second reference foreground image, respectively, to obtain a first reference grayscale histogram and a second reference grayscale histogram;

G: subtracting the second reference grayscale histogram from the first reference grayscale histogram, to obtain a reference water/fat relationship graph;

H: selecting one of the remaining region image masks as a current region image mask;

I: using the current region image mask to extract a first current foreground image from the first image and a second current foreground image from the second image;

J: calculating grayscale histograms for the first current foreground image and the second current foreground image, respectively, to obtain a first current grayscale histogram and a second current grayscale histogram;

K: subtracting the second current grayscale histogram from the first current grayscale histogram, to obtain a current water/fat relationship graph;

L: judging whether the reference water/fat relationship graph and the current water/fat relationship graph have the same pattern characteristics, and if they do, keeping the positions of the first current foreground image and the second current foreground image unchanged; otherwise, replacing the first current foreground image and the second current foreground image; and M: judging whether there is any unprocessed region image mask remaining, and if there is, returning to step H; otherwise, finishing.

According to another embodiment of the present invention, an MRI water/fat image identification device comprises:

a first histogram calculation module, for calculating grayscale histograms for a first image and a second image calculated by a Dixon method, respectively, to obtain a first grayscale histogram and a second grayscale histogram; wherein the first image and the second image form a water/fat image pair;

a first relationship curve calculation module, for subtracting the second grayscale histogram from the first grayscale histogram, to obtain a water/fat relationship graph; and an image type determination module, for searching for the highest peak and lowest trough in the water/fat relationship graph, and judging the positional relationship of the highest peak and the lowest trough in the water/fat relationship graph, and if the highest peak is located behind the lowest trough, determining the first image as being a water image and the second image as being a fat image; otherwise, determining the second image as being a water image and the first image as being a fat image.

According to another embodiment of the present invention, an MRI water/fat image identification device comprises:

an image mask generation module, for using a grayscale histogram obtained for an in-phase image corresponding to a water/fat image pair calculated by a Dixon method to determine an image mask; wherein the water/fat image pair is formed by a first image and a second image;

an image segmentation module, for subjecting the image mask to image segmentation to obtain a region image mask corresponding to each anatomical region;

a reference region selection module, for selecting one of the region image masks as a reference region image mask;

a current region selection module, for selecting a region image mask from unprocessed region image masks as a current region image mask, in the case where there are unprocessed region image masks;

a foreground image extraction module, for using the reference region image mask to extract a first reference foreground image from the first image and a second reference foreground image from the second image; and using the current region image mask to extract a first current foreground image from the first image and a second current foreground image from the second image;

a second histogram calculation module, for calculating grayscale histograms for the first reference foreground image and the second reference foreground image, respectively, to obtain a first reference grayscale histogram and a second reference grayscale histogram; and calculating grayscale histograms for the first current foreground image and the second current foreground image, respectively, to obtain a first current grayscale histogram and a second current grayscale histogram;

a second relationship curve calculation module, for subtracting the second reference grayscale histogram from the first reference grayscale histogram, to obtain a reference water/fat relationship graph; and subtracting the second current grayscale histogram from the first current grayscale histogram, to obtain a current water/fat relationship graph;

a curve pattern comparison module, for comparing the reference water/fat relationship graph with the current water/fat relationship graph to determine whether they have the same pattern characteristics, and obtain a comparison result;

a harmonization processing module, for replacing the first current foreground image and the second current foreground image in the case where the comparison result indicates that the reference water/fat relationship graph and the current water/fat relationship graph have different pattern characteristics; otherwise, keeping the positions of the first current foreground image and the second current foreground image unchanged;

an image type determination module, for searching for the highest peak and lowest trough in the reference water/fat relationship graph obtained by the second relationship curve calculation module once the harmonization processing module has completed harmonization processing of the first image and the second image, judging the positional relationship of the highest peak and lowest trough in the reference water/fat relationship graph, and if the highest peak is located behind the lowest trough, determining the first image as being a water image and the second image as being a fat image; otherwise, determining the second image as being a water image and the first image as being a fat image.

According to another embodiment of the present invention, an MRI water/fat image harmonization device comprises:

an image mask generation module, for using a grayscale histogram obtained for an in-phase image corresponding to a water/fat image pair calculated by a Dixon method to determine an image mask; wherein the water/fat image pair is formed by a first image and a second image;

an image segmentation module, for subjecting the image mask to image segmentation to obtain a region image mask corresponding to each anatomical region;

a reference region selection module, for selecting one of the region image masks as a reference region image mask;

a current region selection module, for selecting a region image mask from unprocessed region image masks as a current region image mask, in the case where there are unprocessed region image masks;

a foreground image extraction module, for using the reference region image mask to extract a first reference foreground image from the first image and a second reference foreground image from the second image; and using the current region image mask to extract a first current foreground image from the first image and a second current foreground image from the second image;

a second histogram calculation module, for calculating grayscale histograms for the first reference foreground image and the second reference foreground image, respectively, to obtain a first reference grayscale histogram and a second reference grayscale histogram; and calculating grayscale histograms for the first current foreground image and the second current foreground image, respectively, to obtain a first current grayscale histogram and a second current grayscale histogram;

a second relationship curve calculation module, for subtracting the second reference grayscale histogram from the first reference grayscale histogram, to obtain a reference water/fat relationship graph; and subtracting the second current grayscale histogram from the first current grayscale histogram, to obtain a current water/fat relationship graph;

a curve pattern comparison module, for comparing the reference water/fat relationship graph with the current water/fat relationship graph to determine whether they have the same pattern characteristics, and obtain a comparison result;

a harmonization processing module, for subjecting the first current foreground image and the second current foreground image to position replacement in the first image and the second image in the case where the comparison result indicates that the reference water/fat relationship graph and the current water/fat relationship graph have different pattern characteristics; otherwise, keeping the positions of the first current foreground image and the second current foreground image in the first image and the second image unchanged;

and the device further comprises: a noise removal and void removal processing module, for processing the image mask determined by the image mask generation module for noise removal and void removal.

In addition, during particular implementation, all or any combination of some of the functional modules in the MRI water/fat image identification device in any of the embodiments of the present invention may be realized by hardware circuitry, or be a computer-executable instruction stored in a computer-readable medium.

When any one or any combination of the various functional modules above is a computer-executable instruction, the MRI water/fat image identification device in the embodiments of the present invention may further comprise: a processor (not shown in the figures) and a computer-readable storage medium (not shown in the figures).

The processor is used for executing a computer-executable instruction in the computer-readable storage medium.

Any one or any combination of the various functional modules above is a computer-executable instruction stored in the computer-readable storage medium.

BRIEF DESCRIPTION OF THE DRAWINGS

Example embodiments of the present invention will be described in detail below with reference to the accompanying drawings, so that those skilled in the art may have a clearer understanding of the above and other features and advantages of the present invention. In the drawings:

FIG. 3a is a fat grayscale histogram; FIG. 3b is a water grayscale histogram.

Figure 1:
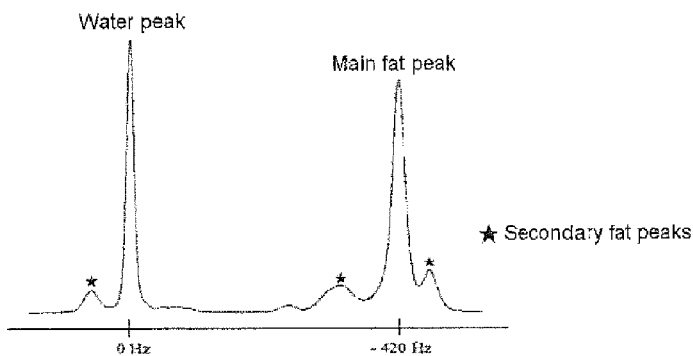
FIG. 1 is a schematic diagram showing the spectral distribution of water/fat peak values.

The labels in the accompanying drawings are as follows:
501—obtaining a first image and a second image
502—calculating grayscale histograms for the two images
503—calculating a water/fat relationship graph
504—searching for the highest peak and lowest trough
505—judging whether the highest peak is located behind the lowest trough, and if it is, performing step 506; otherwise, performing step 507
506—determining the first image as being a water image and the second image as being a fat image
507—determining the second image as being a water image and the first image as being a fat image
801—first histogram calculation module
802—first relationship curve calculation module
803—image type determination module
801a—image mask generation module
801b—foreground image extraction module
1001—obtaining a first image and a second image
1002—determining an image mask
1003—obtaining each region image mask
1004—selecting a reference region image mask
1005—extracting a first reference foreground image and a second reference foreground image
1006—calculating reference grayscale histograms for the two reference foreground images
1007—calculating a reference water/fat relationship graph
1008—selecting a current region image mask
1009—extracting a first current foreground image and a second current foreground image
1010—calculating current grayscale histograms for the two current foreground images
1011—calculating a current water/fat relationship graph
1012—comparing the reference water/fat relationship graph and the current water/fat relationship graph for consistency, and if they are consistent, performing step 1013; otherwise, performing step 1014
1013—keeping the positions of the first current foreground image and second current foreground image in the first image and second image unchanged
1014—subjecting the first current foreground image and second current foreground image to position replacement in the first image and second image
1015—judging whether there is any unprocessed region image mask remaining, and if there is, returning to step 1008; otherwise, finishing
1501—image mask generation module
1502—image segmentation module
1503—reference region selection module
1504—current region selection module
1505—foreground image extraction module
1506—second histogram calculation module
1507—second relationship curve calculation module
1508—curve pattern comparison module
1509—harmonization processing module

DETAILED DESCRIPTION OF THE EXAMPLE EMBODIMENTS

The present invention will be further described in detail in conjunction with the accompanying drawings and embodiments. It should be understood that the particular embodiments described herein are only used to illustrate the present invention but not to limit the present invention.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

At least one embodiment of the present invention provides an MRI water/fat image identification method and device, comprising:

A: obtaining a water/fat image pair calculated by a Dixon method, and marking these as a first image and a second image;

B: calculating grayscale histograms for the first image and the second image, respectively, to obtain a first grayscale histogram and second grayscale histogram;

C: subtracting the second grayscale histogram from the first grayscale histogram to obtain a water/fat relationship graph; and D: searching for the highest peak and lowest trough in the water/fat relationship graph, and judging the positional relationship of the highest peak and the lowest trough in the water/fat relationship graph, and if the highest peak is located behind the lowest trough, determining the first image as being a water image and the second image as being a fat image; otherwise, determining the second image as being a water image and the first image as being a fat image.

Before step B, at least one embodiment of the method further comprises: obtaining an in-phase image corresponding to the water/fat image pair, and using a grayscale histogram of the in-phase image to determine an image mask; and using the image mask to extract a first foreground image from the first image and a second foreground image from the second image. Said step B comprises: calculating grayscale histograms for the first foreground image and the second foreground image, respectively.

In at least one embodiment, the first image and second image each comprise at least two anatomical regions. In at least one embodiment, before step B, the method further comprises:

A21: obtaining an in-phase image corresponding to the water/fat image pair, and using a grayscale histogram of the in-phase image to determine an image mask;

A22: subjecting the image mask to image segmentation, to obtain a region image mask corresponding to each anatomical region;

A23: selecting one of the region image masks as a reference region image mask;

A24: using the reference region image mask to extract a first reference foreground image from the first image and a second reference foreground image from the second image;
A25: calculating grayscale histograms for the first reference foreground image and the second reference foreground image, respectively, to obtain a first reference grayscale histogram and a second reference grayscale histogram;
A26: subtracting the second reference grayscale histogram from the first reference grayscale histogram, to obtain a reference water/fat relationship graph;
A27: selecting one of the remaining region image masks as a current region image mask;
A28: using the current region image mask to extract a first current foreground image from the first image and a second current foreground image from the second image;
A29: calculating grayscale histograms for the first current foreground image and the second current foreground image, respectively, to obtain a first current grayscale histogram and a second current grayscale histogram;
A30: subtracting the second current grayscale histogram from the first current grayscale histogram, to obtain a current water/fat relationship graph;
A31: judging whether the reference water/fat relationship graph and the current water/fat relationship graph have the same pattern characteristics, and if they do, keeping the positions of the first current foreground image and the second current foreground image unchanged; otherwise, replacing the first current foreground image and the second current foreground image;
A32: judging whether there is any unprocessed region image mask remaining, and if there is, returning to step A27; otherwise, performing step B.

In at least one embodiment, the method further comprises: processing the image mask for noise removal and void removal.

Optionally, judging whether the reference water/fat relationship graph and the current water/fat relationship graph have the same pattern characteristics in step A31 involves: taking the dot product of the reference water/fat relationship graph and the current water/fat relationship graph, and if the dot product result is negative, determining that the reference water/fat relationship graph and the current water/fat relationship graph have different patterns; otherwise, determining that the reference water/fat relationship graph and the current water/fat relationship graph have the same pattern.

Alternatively, judging whether the reference water/fat relationship graph and the current water/fat relationship graph have the same pattern characteristics in step A31 involves: judging whether the positional relationship of the highest peak and lowest trough in the reference water/fat relationship graph is the same as the positional relationship of the highest peak and lowest trough in the current water/fat relationship graph, and if it is, determining that the reference water/fat relationship graph and the current water/fat relationship graph have the same pattern; otherwise, determining that the reference water/fat relationship graph and the current water/fat relationship graph have different patterns.

According to another embodiment of the present invention, an MRI water/fat image identification method comprises:
A: obtaining a water/fat image pair calculated by a Dixon method, and marking these as a first image and a second image;
B: obtaining an in-phase image corresponding to the water/fat image pair, and using a grayscale histogram of the in-phase image to determine an image mask;
C: subjecting the image mask to image segmentation, to obtain a region image mask corresponding to each anatomical region;
D: selecting one of the region image masks as a reference region image mask;
E: using the reference region image mask to extract a first reference foreground image from the first image and a second reference foreground image from the second image;
F: calculating grayscale histograms for the first reference foreground image and the second reference foreground image, respectively, to obtain a first reference grayscale histogram and a second reference grayscale histogram;
G: subtracting the second reference grayscale histogram from the first reference grayscale histogram, to obtain a reference water/fat relationship graph;
H: selecting one of the remaining region image masks as a current region image mask;
I: using the current region image mask to extract a first current foreground image from the first image and a second current foreground image from the second image;
J: calculating grayscale histograms for the first current foreground image and the second current foreground image, respectively, to obtain a first current grayscale histogram and a second current grayscale histogram;
K: subtracting the second current grayscale histogram from the first current grayscale histogram, to obtain a current water/fat relationship graph;
L: judging whether the reference water/fat relationship graph and the current water/fat relationship graph have the same pattern characteristics, and if they do, keeping the positions of the first current foreground image and the second current foreground image unchanged; otherwise, replacing the first current foreground image and the second current foreground image;
M: judging whether there is any unprocessed region image mask remaining, and if there is, returning to step H; otherwise, performing step N; and
N: searching for the highest peak and lowest trough in the reference water/fat relationship graph obtained in step G, and judging the positional relationship of the highest peak and the lowest trough in the reference water/fat relationship graph, and if the highest peak is located behind the lowest trough, determining the first image as being a water image and the second image as being a fat image; otherwise, determining the second image as being a water image and the first image as being a fat image.

According to another embodiment of the present invention, an MRI water/fat image harmonization method comprises:
A: obtaining a water/fat image pair calculated by a Dixon method, and marking these as a first image and a second image;
B: obtaining an in-phase image corresponding to the water/fat image pair, and using a grayscale histogram of the in-phase image to determine an image mask;
C: subjecting the image mask to image segmentation, to obtain a region image mask corresponding to each anatomical region;
D: selecting one of the region image masks as a reference region image mask;
E: using the reference region image mask to extract a first reference foreground image from the first image and a second reference foreground image from the second image;
F: calculating grayscale histograms for the first reference foreground image and the second reference foreground image, respectively, to obtain a first reference grayscale histogram and a second reference grayscale histogram;

G: subtracting the second reference grayscale histogram from the first reference grayscale histogram, to obtain a reference water/fat relationship graph;

H: selecting one of the remaining region image masks as a current region image mask;

I: using the current region image mask to extract a first current foreground image from the first image and a second current foreground image from the second image;

J: calculating grayscale histograms for the first current foreground image and the second current foreground image, respectively, to obtain a first current grayscale histogram and a second current grayscale histogram;

K: subtracting the second current grayscale histogram from the first current grayscale histogram, to obtain a current water/fat relationship graph;

L: judging whether the reference water/fat relationship graph and the current water/fat relationship graph have the same pattern characteristics, and if they do, keeping the positions of the first current foreground image and the second current foreground image unchanged; otherwise, replacing the first current foreground image and the second current foreground image;

M: judging whether there is any unprocessed region image mask remaining, and if there is, returning to step H; otherwise, finishing.

The method, in at least one embodiment, further comprises: processing the image mask for noise removal and void removal.

Optionally, judging whether the reference water/fat relationship graph and the current water/fat relationship graph have the same pattern characteristics in step L involves: taking the dot product of the reference water/fat relationship graph and the current water/fat relationship graph, and if the dot product result is negative, determining that the reference water/fat relationship graph and the current water/fat relationship graph have different patterns; otherwise, determining that the reference water/fat relationship graph and the current water/fat relationship graph have the same pattern.

Alternatively, judging whether the reference water/fat relationship graph and the current water/fat relationship graph have the same pattern characteristics in step L involves: judging whether the positional relationship of the highest peak and lowest trough in the reference water/fat relationship graph is the same as the positional relationship of the highest peak and lowest trough in the current water/fat relationship graph, and if it is, determining that the reference water/fat relationship graph and the current water/fat relationship graph have the same pattern; otherwise, determining that the reference water/fat relationship graph and the current water/fat relationship graph have different patterns.

According to another embodiment of the present invention, an MRI water/fat image identification device comprises:

a first histogram calculation module, for calculating grayscale histograms for a first image and a second image calculated by a Dixon method, respectively, to obtain a first grayscale histogram and a second grayscale histogram; wherein the first image and the second image form a water/fat image pair;

a first relationship curve calculation module, for subtracting the second grayscale histogram from the first grayscale histogram, to obtain a water/fat relationship graph; and an image type determination module, for searching for the highest peak and lowest trough in the water/fat relationship graph, and judging the positional relationship of the highest peak and the lowest trough in the water/fat relationship graph, and if the highest peak is located behind the lowest trough, determining the first image as being a water image and the second image as being a fat image; otherwise, determining the second image as being a water image and the first image as being a fat image.

Optionally, the device further comprises:

an image mask generation module, for using a grayscale histogram obtained for an in-phase image corresponding to the water/fat image pair to determine an image mask;

a foreground image extraction module, for using the image mask to extract a first foreground image from the first image and a second foreground image from the second image;

and one said first histogram calculation module obtains a first grayscale histogram and a second grayscale histogram by calculating grayscale histograms for the first foreground image and the second foreground image, respectively.

Optionally, the device further comprises:

an image mask generation module, for using a grayscale histogram obtained for an in-phase image corresponding to the water/fat image pair to determine an image mask;

an image segmentation module, for subjecting the image mask to image segmentation to obtain a region image mask corresponding to each anatomical region;

a reference region selection module, for selecting one of the region image masks as a reference region image mask;

a current region selection module, for selecting a region image mask from unprocessed region image masks as a current region image mask, in the case where there are unprocessed region image masks;

a foreground image extraction module, for using the reference region image mask to extract a first reference foreground image from the first image and a second reference foreground image from the second image; and using the current region image mask to extract a first current foreground image from the first image and a second current foreground image from the second image;

a second histogram calculation module, for calculating grayscale histograms for the first reference foreground image and the second reference foreground image, respectively, to obtain a first reference grayscale histogram and a second reference grayscale histogram; and calculating grayscale histograms for the first current foreground image and the second current foreground image, respectively, to obtain a first current grayscale histogram and a second current grayscale histogram;

a second relationship curve calculation module, for subtracting the second reference grayscale histogram from the first reference grayscale histogram, to obtain a reference water/fat relationship graph; and subtracting the second current grayscale histogram from the first current grayscale histogram, to obtain a current water/fat relationship graph;

a curve pattern comparison module, for comparing the reference water/fat relationship graph with the current water/fat relationship graph to determine whether they have the same pattern characteristics, and obtain a comparison result;

a harmonization processing module, for subjecting the first current foreground image and the second current foreground image to position replacement in the first image and the second image in the case where the comparison result indicates that the reference water/fat relationship graph and the current water/fat relationship graph have different pattern characteristics; otherwise, keeping the positions of the first current foreground image and the second current foreground image unchanged.

Optionally, the curve pattern comparison module comprises: a dot product judgment module or a peak value relationship determination module;

wherein the dot product judgment module is used for taking the dot product of the reference water/fat relationship graph and the current water/fat relationship graph, and if the dot product result is negative, determining that the reference water/fat relationship graph and the current water/fat relationship graph have different patterns; otherwise, determining that the reference water/fat relationship graph and the current water/fat relationship graph have the same pattern;

the peak value relationship determination module is used for judging whether the positional relationship of the highest peak and lowest trough in the reference water/fat relationship graph is the same as the positional relationship of the highest peak and lowest trough in the current water/fat relationship graph, and if it is, determining that the reference water/fat relationship graph and the current water/fat relationship graph have the same pattern; otherwise, determining that the reference water/fat relationship graph and the current water/fat relationship graph have different patterns.

According to another embodiment of the present invention, an MRI water/fat image identification device comprises:

an image mask generation module, for using a grayscale histogram obtained for an in-phase image corresponding to a water/fat image pair calculated by a Dixon method to determine an image mask; wherein the water/fat image pair is formed by a first image and a second image;

an image segmentation module, for subjecting the image mask to image segmentation to obtain a region image mask corresponding to each anatomical region;

a reference region selection module, for selecting one of the region image masks as a reference region image mask;

a current region selection module, for selecting a region image mask from unprocessed region image masks as a current region image mask, in the case where there are unprocessed region image masks;

a foreground image extraction module, for using the reference region image mask to extract a first reference foreground image from the first image and a second reference foreground image from the second image; and using the current region image mask to extract a first current foreground image from the first image and a second current foreground image from the second image;

a second histogram calculation module, for calculating grayscale histograms for the first reference foreground image and the second reference foreground image, respectively, to obtain a first reference grayscale histogram and a second reference grayscale histogram; and calculating grayscale histograms for the first current foreground image and the second current foreground image, respectively, to obtain a first current grayscale histogram and a second current grayscale histogram;

a second relationship curve calculation module, for subtracting the second reference grayscale histogram from the first reference grayscale histogram, to obtain a reference water/fat relationship graph; and subtracting the second current grayscale histogram from the first current grayscale histogram, to obtain a current water/fat relationship graph;

a curve pattern comparison module, for comparing the reference water/fat relationship graph with the current water/fat relationship graph to determine whether they have the same pattern characteristics, and obtain a comparison result;

a harmonization processing module, for replacing the first current foreground image and the second current foreground image in the case where the comparison result indicates that the reference water/fat relationship graph and the current water/fat relationship graph have different pattern characteristics; otherwise, keeping the positions of the first current foreground image and the second current foreground image unchanged;

an image type determination module, for searching for the highest peak and lowest trough in the reference water/fat relationship graph obtained by the second relationship curve calculation module once the harmonization processing module has completed harmonization processing of the first image and the second image, judging the positional relationship of the highest peak and lowest trough in the reference water/fat relationship graph, and if the highest peak is located behind the lowest trough, determining the first image as being a water image and the second image as being a fat image; otherwise, determining the second image as being a water image and the first image as being a fat image.

According to another embodiment of the present invention, an MRI water/fat image harmonization device comprises:

an image mask generation module, for using a grayscale histogram obtained for an in-phase image corresponding to a water/fat image pair calculated by a Dixon method to determine an image mask; wherein the water/fat image pair is formed by a first image and a second image;

an image segmentation module, for subjecting the image mask to image segmentation to obtain a region image mask corresponding to each anatomical region;

a reference region selection module, for selecting one of the region image masks as a reference region image mask;

a current region selection module, for selecting a region image mask from unprocessed region image masks as a current region image mask, in the case where there are unprocessed region image masks;

a foreground image extraction module, for using the reference region image mask to extract a first reference foreground image from the first image and a second reference foreground image from the second image; and using the current region image mask to extract a first current foreground image from the first image and a second current foreground image from the second image;

a second histogram calculation module, for calculating grayscale histograms for the first reference foreground image and the second reference foreground image, respectively, to obtain a first reference grayscale histogram and a second reference grayscale histogram; and calculating grayscale histograms for the first current foreground image and the second current foreground image, respectively, to obtain a first current grayscale histogram and a second current grayscale histogram;

a second relationship curve calculation module, for subtracting the second reference grayscale histogram from the first reference grayscale histogram, to obtain a reference water/fat relationship graph; and subtracting the second current grayscale histogram from the first current grayscale histogram, to obtain a current water/fat relationship graph;

a curve pattern comparison module, for comparing the reference water/fat relationship graph with the current water/fat relationship graph to determine whether they have the same pattern characteristics, and obtain a comparison result;

a harmonization processing module, for subjecting the first current foreground image and the second current foreground image to position replacement in the first image and the second image in the case where the comparison result indicates that the reference water/fat relationship graph and the current water/fat relationship graph have different pattern characteristics; otherwise, keeping the positions of the first current foreground image and the second current foreground image in the first image and the second image unchanged;

and the device further comprises: a noise removal and void removal processing module, for processing the image mask determined by the image mask generation module for noise removal and void removal.

In at least one embodiment of the present invention, based on the formation characteristics of pixels in the water image and fat image, grayscale histograms of the two images are first calculated, one of these grayscale histograms being subtracted from the other to obtain a corresponding water/fat relationship graph; based on the positional relationship of the highest peak and lowest trough in the water/fat relationship graph, the specific type of each image in the water/fat image pair is then determined. The method is simple and easy to implement, and highly reliable. In tests performed on a total of 900 images in 30 groups in the DICOM format obtained from 0.35 T, 1.5 T and 3 T magnetic resonance systems, all were verified as being accurate.

In addition, in at least one embodiment of the present invention, in the case of a water/fat image pair comprising multiple anatomical regions, verification of consistency between water/fat relationship curves of different anatomical regions is used to perform corresponding replacement of water/fat images of anatomical regions with different water/fat relationship curves, thereby enabling consistent water/fat images to be obtained, facilitating subsequent processing.

Furthermore, when performing consistency processing, higher accuracy can be achieved by selecting a region image mask with a larger area as a reference region image mask; moreover, when subjecting water/fat images of anatomical regions of smaller area to position replacement in the water/fat image pair, the amount of calculation is smaller.

At present, the two-point Dixon method and three-point Dixon method are the two most common application methods in Dixon technology. In these two methods, it is assumed that the water signal and fat signal are both single-peak signals in the frequency domain, but in practice, it is only necessary that the water signal be a single-peak signal in the frequency domain; the fat signal is only approximately a single-peak signal in the frequency domain. As FIG. 1 shows, the fat signal in the frequency domain has multiple peaks; the main peak thereof (i.e. the largest peak) is separated from the water signal peak value by 3.5 ppm (parts per million), and this is used to perform water/fat separation. In addition to the main peak, the fat signal is distributed over a relatively wide range in the frequency domain, as exemplified by the secondary fat peak values indicated by a star "★" in FIG. 1.

Once a Dixon method has been used to perform a water/fat separation algorithm, the signal located at the water peak value is isolated in a water image while the signal located at the fat peak value is isolated in a fat image, but signals located at the secondary fat peak values are isolated in the water image and the fat image at the same time. The closer a secondary fat peak value is to the water peak value, the stronger the fat signal thereof isolated in the water image, and correspondingly, the weaker the fat signal thereof isolated in the fat image; and vice versa.

Figure 2:
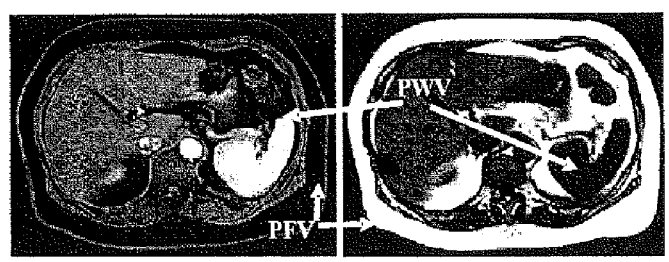
FIG. 2 is a schematic diagram showing the result of water/fat separation in magnetic resonance imaging of tissue containing pure water voxels and pure fat voxels.

In the embodiments of the present invention, the voxels in an image may be divided into three types: pure water voxels, pure fat voxels and mixed water/fat voxels. FIG. 2 shows the result of water/fat separation in magnetic resonance imaging of tissue containing pure water voxels and pure fat voxels, with a water image on the left and a fat image on the right. In the figure, the arrow corresponding to PWV (Pure Water Voxel) points to pure water voxels, while the arrow corresponding to PFV (Pure Fat Voxel) points to pure fat voxels. In addition, most voxels are mixed water/fat voxels.

It can be seen that the signal of any pure water voxel forms a single peak value, and so will be isolated in the water image, while having zero signal strength in the fat image. On the other hand, owing to the presence of secondary fat peak values, although the signal of a pure fat voxel will be mainly isolated in the fat image, non-zero signal strength will remain in the water image. In the case of mixed voxel, part thereof is isolated in the water image, and part in the fat image.

Figures 3A, 3B:
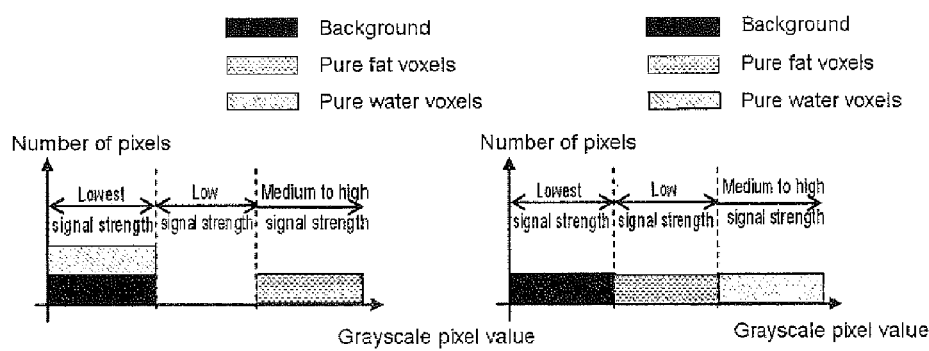
FIGS. 3a and 3b are schematic diagrams showing the composition of water/fat grayscale histograms in terms of different voxel types.

If grayscale histograms are made for the water image and the fat image, respectively, the schematic diagrams showing the composition of water/fat grayscale histograms in terms of different voxel types as shown in FIGS. 3a and 3b can be obtained. FIG. 3a is a fat grayscale histogram; FIG. 3b is a water grayscale histogram. It can be seen that in the water/fat image pair, background noise always has the lowest signal strength, while pure water voxels also have the lowest signal strength in the fat image. It is clear from the above description that pure fat voxels will maintain low signal strength in the water image. In addition, pure water voxels have medium to high signal strength in the water image, while fat voxels have medium to high signal strength in the fat image. Furthermore, mixed water/fat voxels have medium to high signal strength in both images (not shown in the figure), but need not be considered here.

Figure 4A:
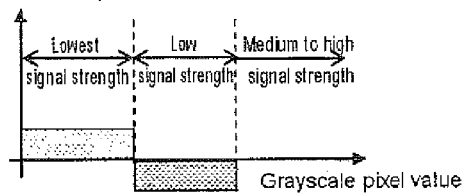
FIG. 4a is a water/fat relationship graph for fat minus water.
Figure 4B:
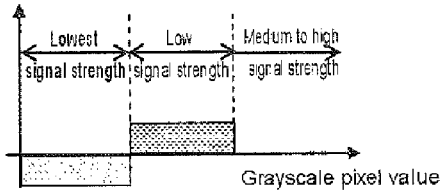
FIG. 4b is a water/fat relationship graph for water minus fat.

If the water grayscale histogram shown in FIG. 3b is subtracted from the fat grayscale histogram shown in FIG. 3a, the water/fat relationship graph shown in FIG. 4a can be obtained. It can be seen that there is a positive peak value in the lowest signal strength region, and a negative peak value, i.e. a trough value, in the low signal strength region. In contrast, if the fat grayscale histogram shown in FIG. 3a is subtracted from the water grayscale histogram shown in FIG. 3b, the water/fat relationship graph shown in FIG. 4b can be obtained. It can be seen that there is a negative peak value, i.e. a trough value, in the lowest signal strength region, and a positive peak value in the low signal strength region.

Based on the above finding, together with the knowledge from experience that nearly every image in practical magnetic resonance applications includes at least one pure water region or pure fat region, the types of the two images in a water/fat image pair can be determined as water image or fat image by calculating water/fat grayscale histograms for the water/fat image pair, subtracting one histogram from the other to obtain a water/fat relationship graph, and then determining whether a fat grayscale histogram has been subtracted from a water grayscale histogram or a water grayscale histogram has been subtracted from a fat grayscale histogram, according to the pattern characteristics of the water/fat relationship graph.

In order to clarify the object, technical solution and advantages of the present invention, it shall be described in further detail below by way of embodiments.

Embodiment 1

Figure 5:
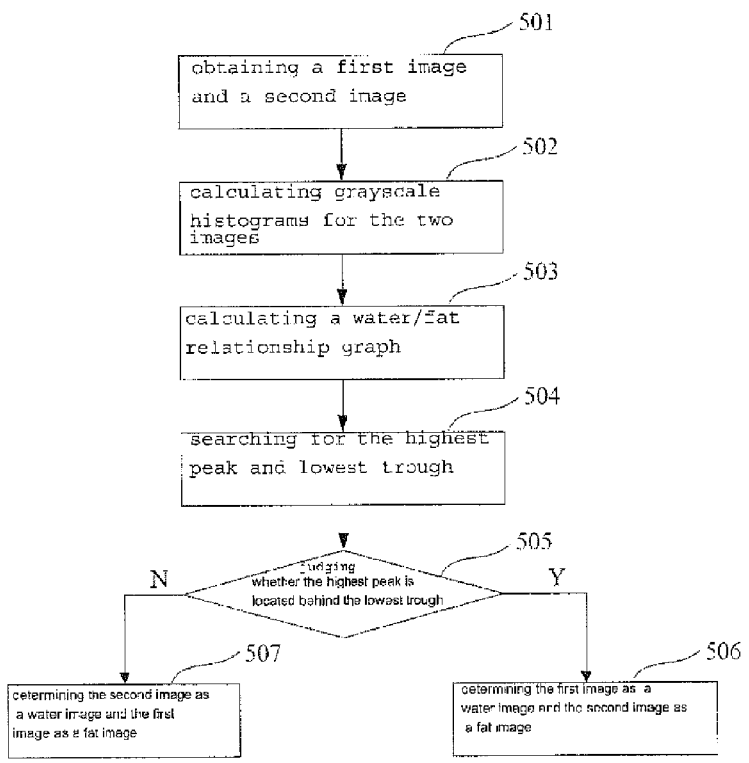
FIG. 5 is an illustrative flow chart of the MRI water/fat image identification method in embodiment 1.

FIG. 5 is an illustrative flow chart of the MRI water/fat image identification method in embodiment 1 of the present invention. As FIG. 5 shows, the procedure comprises the following steps:

Step 501: obtaining a water/fat image pair calculated using a Dixon method, and marking these as a first image and a second image.

In this step, the Dixon method may be any type of Dixon method, such as the two-point Dixon method or three-point Dixon method.

Step 502: calculating grayscale histograms for the first image and the second image, respectively, to obtain a first grayscale histogram and a second grayscale histogram.

Step 503: subtracting the second grayscale histogram from the first grayscale histogram, to obtain a water/fat relationship graph.

Figure 6A:
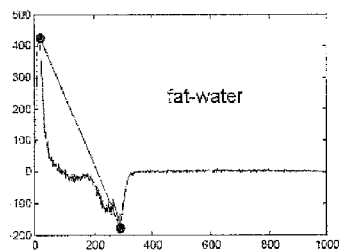
FIGS. 6a and 6b are water/fat relationship graphs in different examples.
Figure 6B:
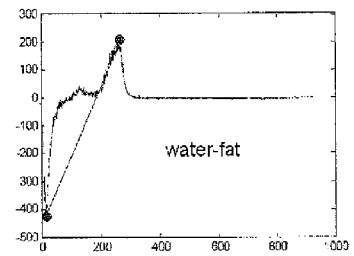

As shown in FIGS. 6a and 6b, FIGS. 6a and 6b each show a water/fat relationship graph in a different example.

Step 504: searching for the highest peak and lowest trough in the water/fat relationship graph.

Taking the water/fat relationship graphs shown in FIGS. 6a and 6b as an example, the highest peak and lowest trough obtained by searching are indicated by a round dot '●' in this step.

Step 505: judging the positional relationship of the highest peak and the lowest trough in the water/fat relationship graph, and if the highest peak is located behind the lowest trough, performing step 506; otherwise, performing step 507.

In this step, the positional relationship of the highest peak and the lowest trough in the water/fat relationship graph may be judged by more than one method.

For example, the sizes of the horizontal coordinate values of the highest peak and lowest trough in the water/fat relationship graph, i.e. the sizes of the grayscale pixel values of the two, can be compared. If the grayscale pixel value of the highest peak is greater than that of the lowest trough, the greatest peak is determined as being located behind the lowest trough; otherwise, the highest peak is determined as being located in front of the lowest trough. Regarding the highest peak and lowest trough in the water/fat relationship graph in FIG. 6a, it can be concluded that the grayscale pixel value of the highest peak is less than that of the lowest trough by comparing the grayscale pixel values of the two, and thus it can be determined that the highest peak is located in front of the lowest trough. Regarding the highest peak and lowest trough in the water/fat relationship graph in FIG. 6b, it can be concluded that the grayscale pixel value of the highest peak is greater than that of the lowest trough, and thus it can be determined that the highest peak is located behind the lowest trough.

Similarly, the highest peak and lowest trough can be joined by a straight line, and the gradient of the straight line judged. If the gradient is greater than 0, it can be determined that the highest peak is located behind the lowest trough; otherwise, the highest peak is determined as being located in front of the lowest trough. Regarding the highest peak and lowest trough in the water/fat relationship graph in FIG. 6a, the gradient of the straight line joining the two can be judged to be less than 0, and so it can be determined that the highest peak is located in front of the lowest trough. Regarding the highest peak and lowest trough in the water/fat relationship graph in FIG. 6b, the gradient of the straight line joining the two can be judged to be greater than 0, and so it can be determined that the highest peak is located behind the lowest trough.

Step 506: determining the first image as being a water image and the second image as being a fat image.

It can be determined that the water/fat relationship graph shown in FIG. 6b has been obtained by subtracting a fat grayscale histogram from a water grayscale histogram, and correspondingly, that the first image is a water image and the second image is a fat image.

Step 507: determining the second image as being a water image and the first image as being a fat image.

It can be determined that the water/fat relationship graph shown in FIG. 6a has been obtained by subtracting a water grayscale histogram from a fat grayscale histogram, and correspondingly, that the first image is a fat image and the second image is a water image.

During particular implementation, the following operations may also be included before step 502 in the above method, to improve the accuracy of calculation.

Step A (not shown in the figures): obtaining an in-phase image corresponding to the water/fat image pair, and using a grayscale histogram of the in-phase image to determine an image mask.

In this step, when obtaining an in-phase image corresponding to the water/fat image pair, an in-phase image obtained by the Dixon method may be obtained directly when using the Dixon method to perform water/fat separation. Alternatively, once the water/fat image pair has been obtained in step 501, the pair of water/fat images can be added together to obtain an in-phase image.

When using the grayscale histogram of the in-phase image to determine an image mask, Otsu's method or another method can be used to separate an image region from the background, to obtain an image mask.

Step B (not shown in the figures): using the image mask to extract a first foreground image from the first image and a second foreground image from the second image.

In this step, the image mask and first image can be multiplied together to obtain a first foreground image, while the image mask and second image can be multiplied together to obtain a second foreground image.

Next, in step 502, a first grayscale histogram and second grayscale histogram are obtained by calculating grayscale histograms for the first foreground image and the second foreground image, respectively.

During particular implementation, the following operation may also be included between step A and step B: processing the image mask for noise removal and void removal, so as to obtain an image mask with noise and voids removed therefrom (not shown in the figures).

During particular implementation, noise and voids in the image mask may be removed using an image opening operation and image filling operation, etc., from image morphological processing.

Figure 7:
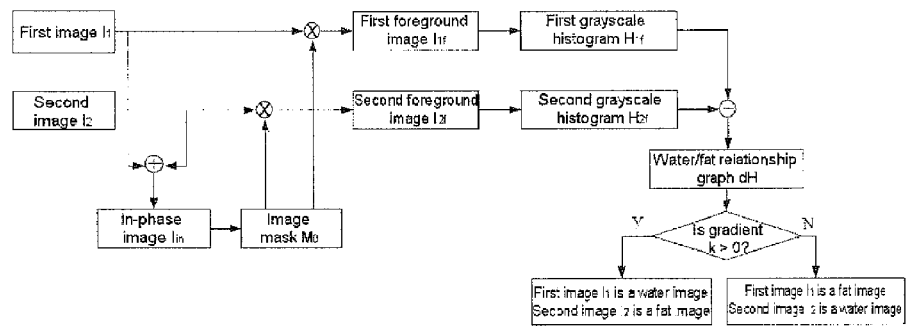
FIG. 7 is a processing flow chart for one example of the water/fat image identification method in embodiment 1.

FIG. 7 shows a processing flow chart for one example of the water/fat image identification method in embodiment 1 of the present invention. As FIG. 7 shows, a water/fat image pair obtained using a Dixon method is first obtained, i.e. a first image I1 and a second image I2; the first image I1 and second image I2 are added together to obtain an in-phase image Iin; based on the in-phase image Iin, an image mask M0 is obtained; the image mask M0 is multiplied with the first image I1 and second image I2 separately, to obtain a first foreground image I1$f$ and a second foreground image I2$f$; grayscale histograms are then calculated for the first foreground image I1$f$ and second foreground image I2$f$, respectively, to obtain a first grayscale histogram H1$f$ and second grayscale histogram H2$f$; the second grayscale histogram H2$f$ is subtracted from the first grayscale histogram H1$f$, to obtain a water/fat relationship graph dH; a judgment is made as to whether the gradient of a connecting line between the highest peak and lowest trough in the water/fat relationship graph dH is greater than 0, and if it is, it is determined that the first image I1 is a water image and the second image I2 is a fat image; otherwise, it is determined that the first image I1 is a fat image and the second image I2 is a water image.

The water/fat image identification method in embodiment 1 of the present invention has been described in detail above; the water/fat image identification device applying the above method in embodiment 1 of the present invention is now described in detail below.

Figure 8:
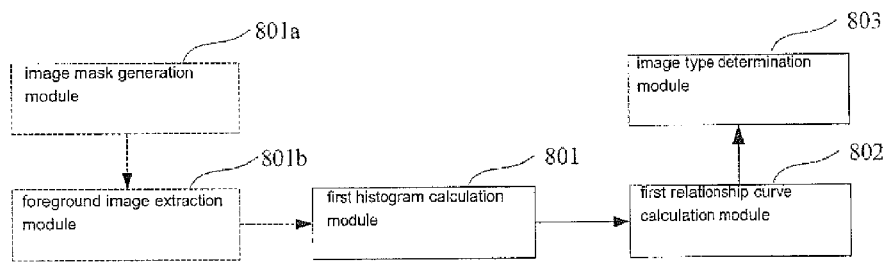
FIG. 8 is an illustrative drawing of the structure of the water/fat image identification device in embodiment 1.

FIG. 8 is an illustrative drawing of the structure of the water/fat image identification device in embodiment 1 of the present invention. As shown by the solid line parts in FIG. 8, the device comprises: a first histogram calculation module 801, a first relationship curve calculation module 802 and an image type determination module 803.

The first histogram calculation module 801 is used to calculate grayscale histograms corresponding to a first image and a second image calculated by a Dixon method, respectively. The first image and the second image form a water/fat image pair.

The first relationship curve calculation module 802 is used to subtract the second grayscale histogram from the first grayscale histogram, to obtain a water/fat relationship graph.

The image type determination module 803 is used to search for the highest peak and lowest trough from the water/fat relationship graph, and judge the positional relationship of the highest peak and the lowest trough in the water/fat relationship graph, and if the highest peak is located behind the lowest trough, to determine the first image as being a water image and the second image as being a fat image; otherwise, to determine the second image as being a water image and the first image as being a fat image.

During particular implementation, the specific operational procedure of the various functional modules in the device shown in FIG. 8 may be the same as the specific operational procedure described in the various steps of the method shown in FIG. 5, and is not repeated here in detail superfluously.

Corresponding to the method shown in FIG. 5, as the dotted line parts in FIG. 8 show, an image mask generation module 801a and a foreground image extraction module 801b are further included before the first histogram calculation module 801.

The image mask generation module 801a is used to determine an image mask using a grayscale histogram obtained for an in-phase image corresponding to the water/fat image pair.

The foreground image extraction module 801b is for using the image mask to extract a first foreground from a first image calculated by a Dixon method, and to extract a second foreground image from a second image calculated by a Dixon method.

Correspondingly, the first histogram calculation module 801 obtains a first grayscale histogram and a second grayscale histogram by calculating grayscale histograms for the first foreground image and the second foreground image, respectively.

Similarly, in a corresponding manner to the method shown in FIG. 5, the device may further comprise a noise removal and void removal processing module (not shown in the figures) between the image mask generation module 801a and the foreground image extraction module 801b, for processing the image mask for noise removal and void removal, so as to obtain an image mask with noise and voids removed therefrom.

During particular implementation, the above first image and second image calculated by a Dixon method may be calculated using a device other than that in this embodiment, in which case the device in this embodiment does not include a water/fat image calculation module; alternatively, they may calculated using the device in this embodiment, in which case the device in this embodiment also includes a water/fat image calculation module (not shown in the figures), for calculating a water/fat image pair by a Dixon method. In one embodiment of the present invention, the water/fat image pair is supplied to the first histogram calculation module 801 for grayscale histograms to be calculated; in another embodiment of the present invention, the water/fat image pair is supplied to the foreground image extraction module 801b for foreground images to be extracted.

The MRI water/fat image identification device in embodiment 1 of the present invention has been described in detail above. During particular implementation, the MRI water/fat image identification device may also have other forms of internal structure; for instance, the various functional units above may be rearranged or further refined. Moreover, the various functional units may each be located in a different entity, or all be located in the same entity; specific configuration may be carried out according to actual requirements.

In addition, during particular implementation, all or any combination of some of the functional modules in the MRI water/fat image identification device in embodiment 1 of the present invention may be realized by hardware circuitry, or be a computer-executable instruction stored in a computer-readable medium.

When any one or any combination of the various functional modules above is a computer-executable instruction, the MRI water/fat image identification device in the embodiments of the present invention may further comprise: a processor (not shown in the figures) and a computer-readable storage medium (not shown in the figures).

The processor is used for executing a computer-executable instruction in the computer-readable storage medium.

Any one or any combination of the various functional modules above is a computer-executable instruction stored in the computer-readable storage medium.

The water/fat image identification method and water/fat image identification device in embodiment 1 may be applied to the known situation where a water/fat image comprises only one connected anatomical region, and also to the situation where a water/fat image includes two or more unconnected anatomical regions.

In practice, consideration is given to the fact that when the water/fat image includes two or more unconnected anatomical regions, such as two hands, two legs, or the chest and two hands, unconnected phases might lead to a water/fat separation error because there is no phase information between different anatomical regions. When a water/fat separation error occurs, it will lead to the image types of different anatomical regions in the same water/fat separated image being different, that is to say, an inversion occurs in the plane of the image. Ideally, one image should include only water images corresponding to each anatomical region, while another image should include only fat images corresponding to each anatomical region.

Figures 9A, 9B:
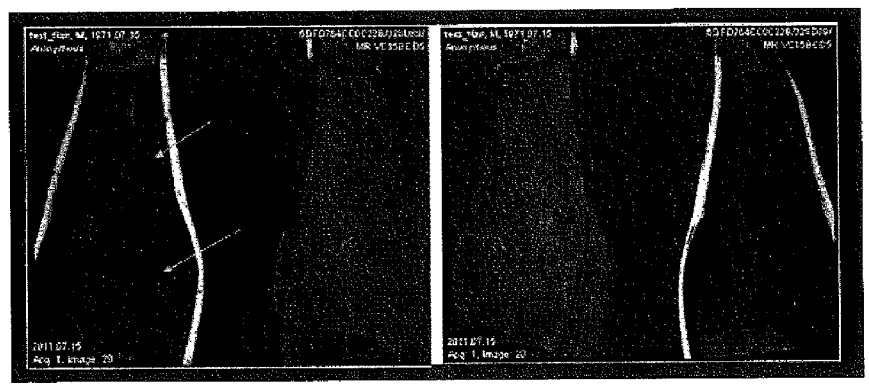
FIGS. 9a and 9b are a water/fat image pair calculated by a Dixon method during magnetic resonance imaging of two lower legs.

FIGS. 9a and 9b show a water/fat image pair calculated by a Dixon method during magnetic resonance imaging of two lower legs. As can be seen, a water/fat separation error has occurred in FIGS. 9a and 9b; a water image of the two lower legs should have appeared in one image, with a fat image of the two lower legs appearing in the other image. However, a fat image of the left lower leg and a water image of the right lower leg have appeared in FIG. 9a, while a water image of the left lower leg and a fat image of the right lower leg have appeared in FIG. 9b.

In view of this, in the case where water/fat images comprise two or more unconnected anatomical regions, the water/fat image pair should preferably be subjected to water/fat image harmonization prior to performing step 502 in the procedure shown in FIG. 5, i.e. each image obtained after water/fat separation should be made to include images of the same type, in order to guarantee the accuracy of water/fat image identification.

The MRI water/fat image harmonization method and device in the embodiments of the present invention will be described in detail below by way of embodiment 2.

Embodiment 2

Figure 10:
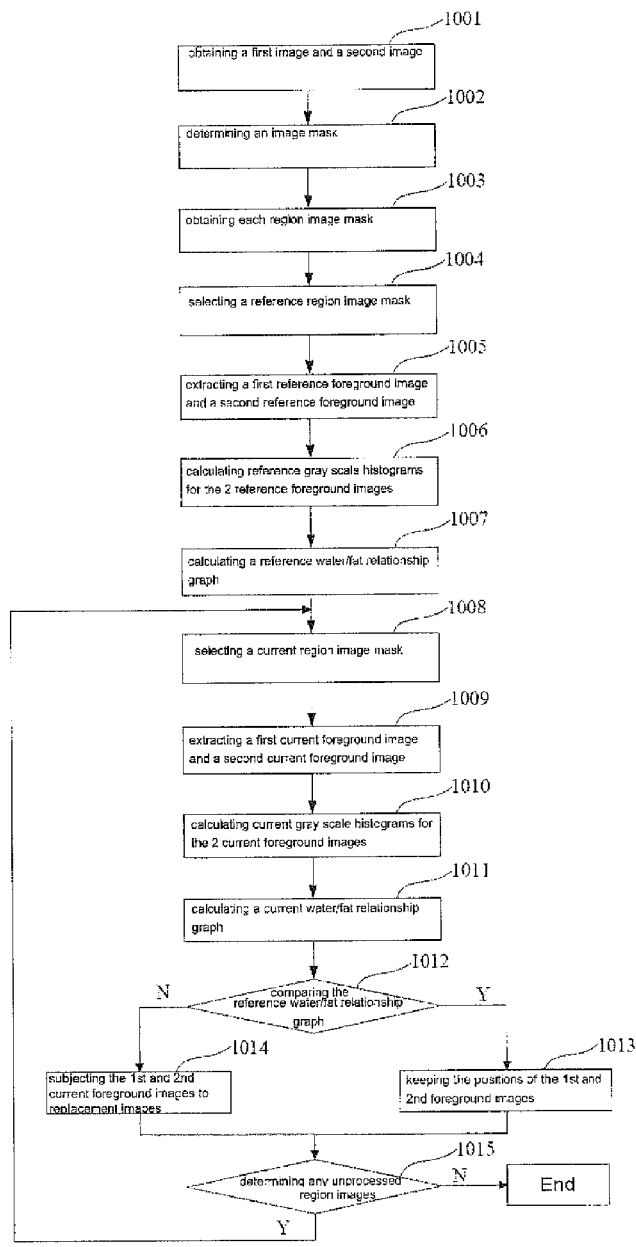
FIG. 10 is an illustrative flow chart of the MRI water/fat image harmonization method in example embodiments.

FIG. 10 is an illustrative flow chart of the MRI water/fat image harmonization method in the embodiments of the present invention. As FIG. 10 shows, the procedure comprises the following steps:

Step 1001: obtaining a water/fat image pair calculated by a Dixon method, and marking these as a first image I1 and a second image I2.

The Dixon method may be any kind of Dixon method, such as the two-point Dixon method or three-point Dixon method.

Step 1002: obtaining an in-phase image Iin corresponding to the water/fat image pair, and using a grayscale histogram of the in-phase image Iin to determine an image mask M0.

In this step, when obtaining an in-phase image corresponding to the water/fat image pair, an in-phase image obtained by the Dixon method may be obtained directly when using the Dixon method to perform water/fat separation. Alternatively, once the water/fat image pair has been obtained in step 1001, the pair of water/fat images can be added together to obtain an in-phase image.

When using the grayscale histogram of the in-phase image to determine an image mask, Otsu's method or another method can be used to separate an image region from the background, to obtain an image mask.

Figure 11:
FIG. 11 is a schematic diagram of the image mask corresponding to the water/fat image pair shown in FIGS. 9a and 9b.

Taking the water/fat image pair shown in FIGS. 9a and 9b as an example, the image mask shown in FIG. 11 may be obtained when determining an image mask on the basis of the in-phase image corresponding to the water/fat image pair.

Step 1003: subjecting the image mask M0 to image segmentation, to obtain region image masks Mk corresponding to each anatomical region.

In this step, image segmentation of the image mask M0 may be accomplished using an image erosion operation and image dilation operation, from morphological processing. For instance, the image mask M0 may be subjected to an image erosion operation until the region mask corresponding to each anatomical region in the image mask M0 becomes a point, for which a unique label k is then set. A region growth algorithm is then used to perform outward dilation, starting at a point after the label, until the size of the corresponding image mask is reached, to obtain each region image mask with unique label k.

During particular implementation, the operation of processing the image mask M0 for noise removal and void removal, so as to obtain an image mask M0 with noise and voids removed, may also be included between step 1002 and step 1003 (not shown in the figure). During particular implementation, noise and voids in the image mask M0 may be removed using an image opening operation and image filling operation, etc., from image morphological processing.

Figure 12A:
FIGS. 12a and 12b are two region image masks corresponding to the left lower leg region and right lower leg region, respectively, obtained by subjecting the image mask shown in FIG. 11 to image segmentation.
Figure 12B:

In this step, when subjecting the image mask shown in FIG. 11 to image segmentation, the two region image masks shown in FIGS. 12a and 12b, corresponding to the left lower leg region and right lower leg region, respectively, may be obtained.

Step 1004: selecting one of the region image masks Mk as a reference region image mask Mref.

In this step, selection may be made according to actual requirements. For instance, selection may be random, or made according to a set rule, such as selecting the region image mask with the greatest area as the reference region image mask.

In this embodiment, it is assumed that the region image mask shown in FIG. 12b is selected as the reference region image mask.

Step 1005: using the reference region image mask Mref to extract a first reference foreground image I1ref from the first image I1 and a second reference foreground image I2ref from the second image I2.

In this step, the reference region image mask Mref and the first image I1 may be multiplied together to obtain the first reference foreground image I1ref, and the reference region image mask Mref and the second image I2 multiplied together to obtain the second reference foreground image I2ref.

Step 1006: calculating grayscale histograms for the first reference foreground image I1ref and the second reference foreground image I2ref, respectively, to obtain a first reference grayscale histogram H1ref and a second reference grayscale histogram H2ref.

Step 1007: subtracting the second reference grayscale histogram I2ref from the first reference grayscale histogram I1ref, to obtain a reference water/fat relationship graph dHref.

Figure 13A:
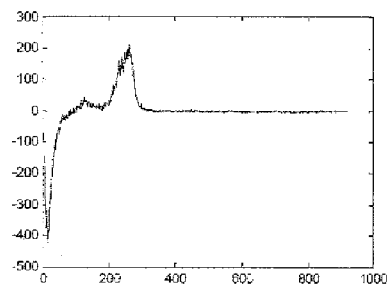
FIGS. 13a and 13b are reference water/fat relationship graphs corresponding to the two region image masks shown in FIGS. 12a and 12b.
Figure 13B:
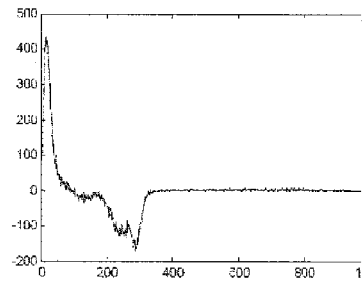

In this embodiment, regarding the reference region image mask shown in FIG. 12b, the reference water/fat relationship graph shown in FIG. 13b may be correspondingly obtained.

Step 1008: selecting one of the remaining region image masks as a current region image mask Mc.

In this embodiment, the region image mask shown in FIG. 12a is selected as the current region image mask.

Step 1009: using the current region image mask Mc to extract a first current foreground image I1c from the first image I1 and a second current foreground image I2c from the second image I2.

In this step, the current region image mask Mc and the first image I1 may be multiplied together to obtain the first current foreground image I1c, and the current region image mask Mc and the second image I2 multiplied together to obtain the second current foreground image I2c.

Step 1010: calculating grayscale histograms for the first current foreground image I1c and the second current foreground image I2c, respectively, to obtain a first current grayscale histogram H1c and a second current grayscale histogram H2c.

Step 1011: subtracting the second current grayscale histogram H2c from the first current grayscale histogram H1c, to obtain a current water/fat relationship graph dHc.

In this embodiment, regarding the current region image mask shown in FIG. 12a, the current water/fat relationship graph shown in FIG. 13a may be correspondingly obtained.

Step 1012: judging whether the reference water/fat relationship graph dHref and the current water/fat relationship graph dHc have the same pattern characteristics, and if they do, performing step 1013; otherwise, performing step 1014.

In this step, several methods may be used to judge whether the reference water/fat relationship graph dHref and the current water/fat relationship graph dHc have the same pattern characteristics.

For example, the dot product of the reference water/fat relationship graph dHref and the current water/fat relationship graph dHc may be taken, and if the dot product result is negative, it is determined that the two graphs have different pattern characteristics; otherwise, it can be determined that the two graphs have the same pattern characteristics.

Similarly, a judgment may be made as to whether the positional relationship of the highest peak and lowest trough is the same in the two graphs, and if it is, it is determined that the two graphs have the same pattern characteristics; otherwise, it can be determined that the two graphs have different pattern characteristics.

The method by which the positional relationship of the highest peak and lowest trough in the water/fat relationship curves is determined may be the same as that described in step 505.

Step 1013: keeping the positions of the first current foreground image I1c and the second current foreground image I2c in the first image I1 and the second image I2 unchanged, then performing step 1015.

Step 1014: subjecting the first current foreground image I1c and the second current foreground image I2c to position replacement in the first image I1 and the second image I2.

Step 1015: judging whether there is any unprocessed region image mask remaining, and if there is, returning to step 1008; otherwise, ending the water/fat image harmonization procedure.

Figures 14A, 14B:
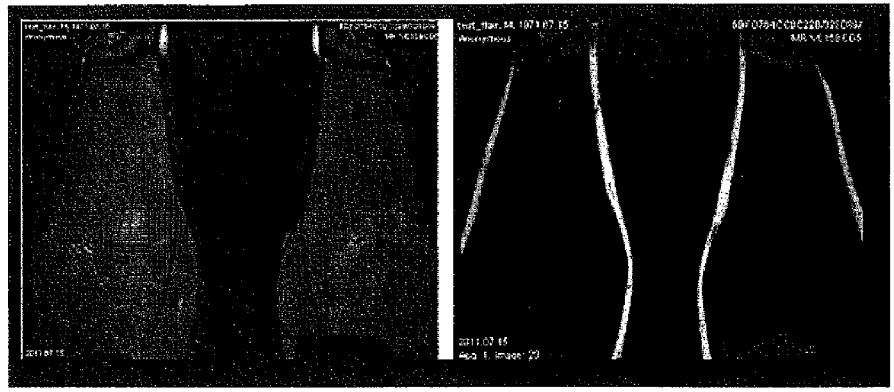
FIGS. 14a and 14b are a water/fat image pair obtained by subjecting the water/fat image pair shown in FIGS. 9a and 9b to harmonization processing.

In this embodiment, in the case of the water/fat image pair shown in FIGS. 9a and 9b, the water/fat image pair shown in FIGS. 14a and 14b may be obtained after the MRI water/fat image harmonization processing shown in FIG. 10. FIG. 14a comprises a water image of two lower legs; FIG. 14b comprises a fat image of two lower legs. In this way, harmonization of water/fat images is achieved.

In practice, once the MRI water/fat image harmonization processing shown in FIG. 10 has been completed, execution of the procedure shown in FIG. 5 may be continued, starting at step 502 in FIG. 5, so as to obtain the water/fat image identification method in embodiment 2; thus, once the water/fat images have been harmonized, the types of the harmonized water/fat images are identified.

Before step 502, the water/fat image identification in embodiment 2 may further include: using the image mask M0 in step 1002 or the image mask M0 with noise and voids removed therefrom to extract a first foreground image from the first image I1 and a second foreground image from the second image I2.

Correspondingly, in step 502, a first grayscale histogram and a second grayscale histogram may be obtained by calculating grayscale histograms for the first foreground image and the second foreground image, respectively.

In addition, once the MRI water/fat image harmonization processing shown in FIG. 10 above is complete, the types of the first image and second image may be determined on the basis of the positional relationship of the highest peak and lowest trough in the reference water/fat relationship graph obtained in step 1007, thereby obtaining another water/fat image identification method in embodiment 2.

In practice, the MRI water/fat image harmonization method shown in FIG. 10 above may also be used alone, i.e. after subjecting a water/fat image pair to harmonization processing alone, the harmonized water/fat image pair obtained is made available for subsequent processing. Subsequent processing may be: performing water/fat image identification using the method shown in FIG. 5, or performing water/fat image identification using another water/fat image identification method. Subsequent processing may of course also be other processing. It is not defined here.

The water/fat image harmonization method in embodiment 2 of the present invention has been described in detail above. The water/fat image harmonization device applying the above method in embodiment 2 of the present invention is now described in detail below.

Figure 15:
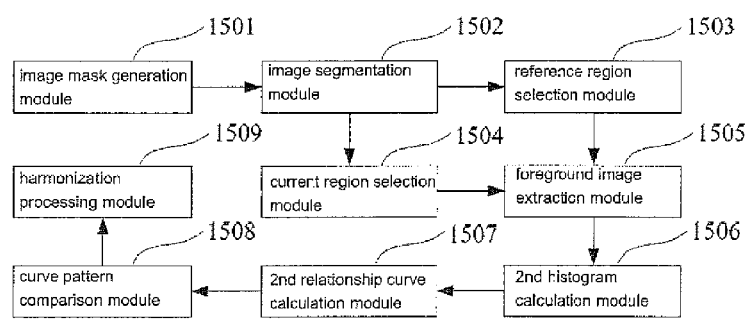
FIG. 15 is an illustrative drawing of the structure of the water/fat image harmonization device in embodiment 2.

FIG. 15 is an illustrative drawing of the structure of the water/fat image harmonization device in embodiment 2 of the present invention. As FIG. 15 shows, the device comprises: an image mask generation module 1501, an image segmentation module 1502, a reference region selection module 1503, a current region selection module 1504, a foreground image extraction module 1505, a second histogram calculation module 1506, a second relationship curve calculation module 1507, a curve pattern comparison module 1508 and a harmonization processing module 1509.

The image mask generation module 1501 is used to determine an image mask using a grayscale histogram obtained for an in-phase image corresponding to a water/fat image pair calculated by a Dixon method; the water/fat image pair is formed by a first image and a second image.

The image segmentation module 1502 is for subjecting the image mask to image segmentation to obtain a region image mask corresponding to each anatomical region.

The reference region selection module 1503 is for selecting one of the region image masks as a reference region image mask.

The current region selection module 1504 is for selecting a region image mask from unprocessed region image masks as a current region image mask, in the case where there are unprocessed region image masks.

The foreground image extraction module 1505 is for using the reference region image mask to extract a first reference foreground image from the first image and a second reference foreground image from the second image; and using the current region image mask to extract a first current foreground image from the first image and a second current foreground image from the second image.

The second histogram calculation module 1506 is for calculating grayscale histograms for the first reference foreground image and the second reference foreground image, respectively, to obtain a first reference grayscale histogram and a second reference grayscale histogram; and calculating grayscale histograms for the first current foreground image and the second current foreground image, respectively, to obtain a first current grayscale histogram and a second current grayscale histogram.

The second relationship curve calculation module 1507 is for subtracting the second reference grayscale histogram from the first reference grayscale histogram, to obtain a reference water/fat relationship graph; and subtracting the second current grayscale histogram from the first current grayscale histogram, to obtain a current water/fat relationship graph.

The curve pattern comparison module 1508 is for comparing the reference water/fat relationship graph with the current water/fat relationship graph to determine whether they have the same pattern characteristics, and obtain a comparison result.

The harmonization processing module 1509 is for subjecting the first current foreground image and the second current foreground image to position replacement in the first image and the second image in the case where the comparison result indicates that the reference water/fat relationship graph and the current water/fat relationship graph have different pattern characteristics; otherwise, keeping the positions of the first current foreground image and the second current foreground image in the first image and the second image unchanged.

During particular implementation, a noise removal and void removal processing module (not shown in the figure) may also be included between the image mask generation module 1501 and the image segmentation module 1502, for processing the image mask for noise removal and void removal, to obtain an image mask with noise and voids removed.

During particular implementation, the specific operational procedure of the various functional modules in the above water/fat image harmonization device may be the same as the specific operational procedure described in the various steps of the water/fat image harmonization method shown in FIG. 10, and is not repeated here in detail superfluously.

In practice, the MRI water/fat image harmonization device shown in FIG. 15 above may also be used alone, i.e. after subjecting a water/fat image pair to harmonization processing alone, the harmonized water/fat image pair obtained is made available for subsequent processing. Subsequent processing may be: performing water/fat image identification using the method shown in FIG. 5, or performing water/fat image identification using another water/fat image identification method. Subsequent processing may of course also be other processing. It is not defined here.

The MRI water/fat image harmonization device shown in FIG. 15 above may also be disposed in the water/fat image identification device. In this case, the water/fat image identification device in embodiment 2 includes not only all the modules in FIG. 15 above, but also the first histogram calculation module 801, first relationship curve calculation module 802 and image type determination module 803 in FIG. 8. The harmonization processing module 1509 is connected to the first histogram calculation module 801. In this way, once the water/fat images have been harmonized, the types of the harmonized water/fat images are identified.

Alternatively, the MRI water/fat image harmonization device shown in FIG. 15 above may also be disposed in another water/fat image identification device. In this case, another water/fat image identification device in embodiment 2 includes not only all the modules in FIG. 15 above, but also: an image type determination module (not shown in the figure), for determining the types of the first image and second image on the basis of the positional relationship of the highest peak and lowest trough in the reference water/fat relationship graph obtained by the second relationship curve calculation module 1507, after the harmonization processing module 1509 has completed harmonization processing of the water/fat images of all anatomical regions. For instance: the image type determination module is used for searching for the highest peak and lowest trough in the reference water/fat relationship graph, and judging the positional relationship of the highest peak and the lowest trough in the reference water/fat relationship graph, and if the highest peak is located behind the lowest trough, determining the first image as being a water image and the second image as being a fat image; otherwise, determining the second image as being a water image and the first image as being a fat image.

In addition, during particular implementation, the above first image and second image calculated by a Dixon method may be calculated by a device other than that in embodiment 2, in which case the device in this embodiment does not include a water/fat image calculation module, or calculated by the device in this embodiment, in which case the device in this embodiment also comprises a water/fat image calculation module (not shown in the figure), for calculating a water/fat image pair by a Dixon method. In the water/fat image harmonization device in embodiment 2 of the present invention, the water/fat image pair is supplied to the foreground image extraction module 1505 for foreground images to be extracted; in a water/fat image identification device described in embodiment 2 of the present invention, the water/fat image pair is simultaneously supplied to the foreground image extraction module 1505 and the first histogram calculation module 801. In another water/fat image identification device described in embodiment 2 of the present invention, the water/fat image pair is supplied to the foreground image extraction module 1505.

Correspondingly, the above obtained in-phase image corresponding to the water/fat image pair calculated by a Dixon method may be calculated using a device other than that in this embodiment, in which case the device in this embodiment does not include an in-phase image calculation module. Alternatively, the above in-phase image may be calculated using the device in this embodiment. If the device in this embodiment includes the above water/fat image calculation module (not shown in the figure), the in-phase image may be calculated by the water/fat image calculation module. If the device in this embodiment does not include the above water/fat image calculation module, this embodiment may include an in-phase image calculation module (not shown in the figure), for adding together the pair of water/fat images obtained by calculation by a Dixon method to obtain an in-phase image corresponding to the water/fat image pair, and supplying the in-phase image to the image mask generation module 1501.

The MRI water/fat image harmonization device and two kinds of water/fat image identification device in embodiment 2 of the present invention have been described in detail above. During particular implementation, the MRI water/fat image harmonization device and water/fat image identification device may also have other forms of internal structure; for instance, the various functional units above may be rearranged or further refined. Moreover, the various functional units may each be located in a different entity, or all be located in the same entity; specific configuration may be carried out according to actual requirements.

In addition, during particular implementation, all or any combination of some of the functional modules in the MRI water/fat image harmonization device or water/fat image identification device in embodiment 2 of the present invention may be realized by hardware circuitry, or be a computer-executable instruction stored in a computer-readable medium.

When any one or any combination of the various functional modules of the MRI water/fat image harmonization device in embodiment 2 of the present invention is a computer-executable instruction, the MRI water/fat image harmonization device in the embodiments of the present invention may further comprise: a processor (not shown in the figures) and a computer-readable storage medium (not shown in the figures).

The processor is used for executing a computer-executable instruction in the computer-readable storage medium.

Any one or any combination of the various functional modules of the MRI water/fat image harmonization device in embodiment 2 of the present invention is a computer-executable instruction stored in the computer-readable storage medium.

Similarly, in the case of any MRI water/fat image identification device in embodiment 2 of the present invention, when any one or any combination of the various functional modules of the MRI water/fat image identification device in embodiment 2 of the present invention is a computer-executable instruction, the MRI water/fat image identification device in the embodiments of the present invention may further comprise: a processor (not shown in the figures) and a computer-readable storage medium (not shown in the figures).

The processor is used for executing a computer-executable instruction in the computer-readable storage medium.

Any one or any combination of the various functional modules of the MRI water/fat image identification device in embodiment 2 of the present invention is a computer-executable instruction stored in the computer-readable storage medium.

MRI equipment in the embodiments of the present invention may comprise an MRI water/fat image identification device or MRI water/fat image harmonization device realized in any specific form in the various embodiments of the present invention.

Disclosed, in embodiments of the present invention, is a water/fat image identification method and device, and a harmonization method and device. The water/fat image identification method comprises: A: obtaining a water/fat image pair calculated by a Dixon method, and marking these as a first image and a second image; B: calculating grayscale histograms for the first image and the second image, respectively, to obtain a first grayscale histogram and second grayscale histogram; C: subtracting the second grayscale histogram from the first grayscale histogram to obtain a water/fat relationship graph; D: searching for the highest peak and lowest trough in the water/fat relationship graph, and if the highest peak is located behind the lowest trough, determining the first image as being a water image and the second image as being a fat image; otherwise, determining the opposite. Embodiments of the present invention can accurately identify water images and fat images.

Described above are merely preferred embodiments of the present invention, which are not intended to limit it. All amendments, equivalent substitutions and improvements made without departing from the spirit and principles of the present invention should be included within the scope of protection thereof.

What is claimed is:

1. An MRI water/fat image identification method, comprising:
   obtaining, via a processor, a water/fat image pair calculated by a Dixon method, and marking the pair as a first image and a second image;
   calculating, via the processor, grayscale histograms for the first image and the second image, respectively, to obtain a first grayscale histogram and second grayscale histogram;
   subtracting, via the processor, the second grayscale histogram from the first grayscale histogram to obtain a water/fat relationship graph; and
   searching, via the processor, a relatively highest peak and relatively lowest trough in the water/fat relationship graph, and judging a positional relationship of the relatively highest peak and the lowest trough in the water/fat relationship graph; and
   determining, via the processor, the first image as being a water image and the second image as being a fat image if the relatively highest peak is located behind the relatively lowest trough; and
   determining, via the processor, the second image as being a water image and the first image as being a fat image if the relatively highest peak is not located behind the relatively lowest trough.

2. The method of claim 1, wherein, before said calculating, the method further comprises: obtaining an in-phase image corresponding to the water/fat image pair, and using a grayscale histogram of the in-phase image to determine an image mask; and using the image mask to extract a first foreground image from the first image and a second foreground image from the second image; and
   wherein the calculating comprises: calculating grayscale histograms for the first foreground image and the second foreground image, respectively.

3. The method of claim 1, wherein the first image and second image each comprise at least two anatomical regions;
   wherein before the calculating, the method further comprises:
   obtaining an in-phase image corresponding to the water/fat image pair, and using a grayscale histogram of the in-phase image to determine an image mask;
   subjecting the image mask to image segmentation, to obtain a region image mask corresponding to each anatomical region;
   selecting one of the region image masks as a reference region image mask;
   using the reference region image mask to extract a first reference foreground image from the first image and a second reference foreground image from the second image;
   calculating grayscale histograms for the first reference foreground image and the second reference foreground image, respectively, to obtain a first reference grayscale histogram and a second reference grayscale histogram;
   subtracting the second reference grayscale histogram from the first reference grayscale histogram, to obtain a reference water/fat relationship graph;
   selecting one of the remaining region image masks as a current region image mask;
   using the current region image mask to extract a first current foreground image from the first image and a second current foreground image from the second image;
   calculating grayscale histograms for the first current foreground image and the second current foreground image, respectively, to obtain a first current grayscale histogram and a second current grayscale histogram;
   subtracting the second current grayscale histogram from the first current grayscale histogram, to obtain a current water/fat relationship graph;
   judging whether the reference water/fat relationship graph and the current water/fat relationship graph have the same pattern characteristics, and if the reference water/fat relationship graph and the current water/fat relationship graph do have the same pattern characteristics, keeping the positions of the first current foreground image and the second current foreground image unchanged; and if the reference water/fat relationship graph and the current water/fat relationship graph do not have the same pattern characteristics, replacing the first current foreground image and the second current foreground image; and judging whether there is any unprocessed region image mask remaining, and if there is, returning to the selecting of one of the remaining region image masks; and if there is not, performing the calculating.

4. The method of claim 3, wherein the judging of whether the reference water/fat relationship graph and the current water/fat relationship graph have the same pattern characteristics includes at least one of:

taking a dot product of the reference water/fat relationship graph and the current water/fat relationship graph, and if the dot product result is negative, determining that the reference water/fat relationship graph and the current water/fat relationship graph have different patterns; and if the dot product result is not negative, determining that the reference water/fat relationship graph and the current water/fat relationship graph have the same pattern; and judging whether the positional relationship of the relatively highest peak and the relatively lowest trough in the reference water/fat relationship graph is the same as the positional relationship of the relatively highest peak and the relatively lowest trough in the current water/fat relationship graph, and if it is, determining that the reference water/fat relationship graph and the current water/fat relationship graph have the same pattern; and if it is not, determining that the reference water/fat relationship graph and the current water/fat relationship graph have different patterns.

5. A computer-readable medium comprising at least one computer-executable instruction stored therein, configured to execute the method of claim 1 when the computer-readable medium is run by the processor.

6. An MRI water/fat image identification method, comprising:

obtaining, via a processor, a water/fat image pair calculated by a Dixon method, and marking the pair as a first image and a second image;

obtaining, via the processor, an in-phase image corresponding to the water/fat image pair, and using a grayscale histogram of the in-phase image to determine an image mask;

subjecting the image mask to image segmentation, to obtain a region image mask corresponding to each anatomical region;

selecting, via the processor, one of the region image masks as a reference region image mask;

using the reference region image mask to extract a first reference foreground image from the first image and a second reference foreground image from the second image;

calculating, via the processor, grayscale histograms for the first reference foreground image and the second reference foreground image, respectively, to obtain a first reference grayscale histogram and a second reference grayscale histogram;

subtracting, via the processor, the second reference grayscale histogram from the first reference grayscale histogram, to obtain a reference water/fat relationship graph;

selecting, via the processor, one of the remaining region image masks as a current region image mask;

using the current region image mask to extract a first current foreground image from the first image and a second current foreground image from the second image;

calculating, via the processor, grayscale histograms for the first current foreground image and the second current foreground image, respectively, to obtain a first current grayscale histogram and a second current grayscale histogram;

subtracting, via the processor, the second current grayscale histogram from the first current grayscale histogram, to obtain a current water/fat relationship graph;

judging, via the processor, whether the reference water/fat relationship graph and the current water/fat relationship graph have the same pattern characteristics;

keeping the positions of the first current foreground image and the second current foreground image unchanged if the reference water/fat relationship graph and the current water/fat relationship graph are judged to have the same pattern characteristics;

replacing, via the processor, the first current foreground image and the second current foreground image if the reference water/fat relationship graph and the current water/fat relationship graph are not judged to have the same pattern characteristics;

judging, via the processor, whether there is any unprocessed region image mask remaining;

returning, via the processor, to the selecting of one of the remaining region image masks if it is judged that any unprocessed region image mask remains;

searching, via the processor, if it is judged that any unprocessed region image mask does not remain, for a relatively highest peak and relatively lowest trough in the reference water/fat relationship graph obtained;

judging, via the processor, the positional relationship of the highest peak and the lowest trough in the reference water/fat relationship graph;

determining, via the processor, if the relatively highest peak is judged to be located behind the relatively lowest trough, the first image as being a water image and the second image as being a fat image; and determining, via the processor, if the relatively highest peak is not judged to be located behind the relatively lowest trough, the second image as being a water image and the first image as being a fat image.

7. A computer-readable medium comprising at least one computer-executable instruction stored therein, configured to execute the method of claim 6 when the computer-readable medium is run by the processor.

8. An MRI water/fat image harmonization method, comprising:

obtaining, via a processor, a water/fat image pair calculated by a Dixon method, and marking the pair as a first image and a second image;

obtaining, via the processor, an in-phase image corresponding to the water/fat image pair, and using a grayscale histogram of the in-phase image to determine an image mask;

subjecting the image mask to image segmentation, to obtain a region image mask corresponding to each anatomical region;

selecting, via the processor, one of the region image masks as a reference region image mask;

using the reference region image mask to extract a first reference foreground image from the first image and a second reference foreground image from the second image;

calculating, via the processor, grayscale histograms for the first reference foreground image and the second reference foreground image, respectively, to obtain a first reference grayscale histogram and a second reference grayscale histogram;

subtracting, via the processor, the second reference grayscale histogram from the first reference grayscale histogram, to obtain a reference water/fat relationship graph;

selecting, via the processor, one of the remaining region image masks as a current region image mask;

using the current region image mask to extract a first current foreground image from the first image and a second current foreground image from the second image;

calculating, via the processor, grayscale histograms for the first current foreground image and the second current foreground image, respectively, to obtain a first current grayscale histogram and a second current grayscale histogram;

subtracting, via the processor, the second current grayscale histogram from the first current grayscale histogram, to obtain a current water/fat relationship graph;

judging, via the processor, whether the reference water/fat relationship graph and the current water/fat relationship graph have the same pattern characteristics;

keeping, via the processor, if the reference water/fat relationship graph and the current water/fat relationship graph are judged to have the same pattern characteristics, the positions of the first current foreground image and the second current foreground image unchanged;

replacing, via the processor, if the reference water/fat relationship graph and the current water/fat relationship graph are not judged to have the same pattern characteristics, the first current foreground image and the second current foreground image;

judging, via the processor, whether there is any unprocessed region image mask remaining;

returning, via the processor, to the selecting of one of the remaining region image masks if it is judged that there is an unprocessed region image mask remaining; and finishing, via the processor, if it is judged that there are no unprocessed region image masks remaining.

9. The method of claim 8, wherein the judging of whether the reference water/fat relationship graph and the current water/fat relationship graph have the same pattern characteristics includes at least one of:

taking a dot product of the reference water/fat relationship graph and the current water/fat relationship graph, and if the dot product result is negative, determining that the reference water/fat relationship graph and the current water/fat relationship graph have different patterns; and if the dot product result is not negative, determining that the reference water/fat relationship graph and the current water/fat relationship graph have the same pattern; and judging whether the positional relationship of a relatively highest peak and relatively lowest trough in the reference water/fat relationship graph is the same as the positional relationship of the relatively highest peak and relatively lowest trough in the current water/fat relationship graph, and if it is, determining that the reference water/fat relationship graph and the current water/fat relationship graph have the same pattern; and if it is not, determining that the reference water/fat relationship graph and the current water/fat relationship graph have different patterns.

10. A computer-readable medium comprising at least one computer-executable instruction stored therein, configured to execute the method of claim 8 when the computer-readable medium is run by the processor.

11. An MRI water/fat image identification device, comprising:

a processor configured to:

calculate, via a first histogram calculation module, grayscale histograms for a first image and a second image calculated by a Dixon method, respectively, to obtain a first grayscale histogram and a second grayscale histogram, wherein the first image and the second image form a water/fat image pair;

subtract, via a first relationship curve calculation module, the second grayscale histogram from the first grayscale histogram, to obtain a water/fat relationship graph; and search, via an image type determination module, a relatively highest peak and relatively lowest trough in the water/fat relationship graph, and configured to judge the positional relationship of the relatively highest peak and the relatively lowest trough in the water/fat relationship graph, and if the relatively highest peak is judged to be located behind the relatively lowest trough, the image type determination module is configured to determine the first image as being a water image and the second image as being a fat image; and if the relatively highest peak is judged not to be located behind the relatively lowest trough, the image type determination module is configured to determine the second image as being a water image and the first image as being a fat image.

12. The device of claim 11, wherein the processor further comprising:

an image mask generation module, configured to use a grayscale histogram obtained for an in-phase image corresponding to the water/fat image pair to determine an image mask; and a foreground image extraction module, configured to use the image mask to extract a first foreground image from the first image and a second foreground image from the second image, wherein said first histogram calculation module is configured to obtain a first grayscale histogram and a second grayscale histogram by calculating grayscale histograms for the first foreground image and the second foreground image, respectively.

13. The device of claim 11, wherein the processor further comprising:

an image mask generation module, configured to use a grayscale histogram obtained for an in-phase image corresponding to the water/fat image pair to determine an image mask;

an image segmentation module, configured to subject the image mask to image segmentation to obtain a region image mask corresponding to each anatomical region;

a reference region selection module, configured to select one of the region image masks as a reference region image mask;

a current region selection module, configured to select a region image mask from unprocessed region image masks as a current region image mask, in the case where there are unprocessed region image masks;

a foreground image extraction module, configured to use the reference region image mask to extract a first reference foreground image from the first image and a second reference foreground image from the second image, and configured to use the current region image mask to extract a first current foreground image from the first image and a second current foreground image from the second image;

a second histogram calculation module, configured to calculate grayscale histograms for the first reference foreground image and the second reference foreground image, respectively, to obtain a first reference grayscale histogram and a second reference grayscale histogram, and configured to calculate grayscale histograms for the first current foreground image and the second current foreground image, respectively, to obtain a first current grayscale histogram and a second current grayscale histogram;

a second relationship curve calculation module, configured to subtract the second reference grayscale histogram from the first reference grayscale histogram, to obtain a reference water/fat relationship graph, and configured to subtract the second current grayscale histogram from the first current grayscale histogram, to obtain a current water/fat relationship graph;

a curve pattern comparison module, configured to compare the reference water/fat relationship graph with the current water/fat relationship graph to determine whether they have the same pattern characteristics, and configured to obtain a comparison result; and a harmonization processing module, configured to subject the first current foreground image and the second current foreground image to position replacement in the first image and the second image in the case where the comparison result indicates that the reference water/fat relationship graph and the current water/fat relationship graph have different pattern characteristics, and in the case where the comparison result does not indicate that the reference water/fat relationship graph and the current water/fat relationship graph have different pattern characteristics, configured to keeping the positions of the first current foreground image and the second current foreground image unchanged.

14. The device of claim 13, wherein the curve pattern comparison module comprises:
a dot product judgment module or a peak value relationship determination module; wherein
the dot product judgment module is configured to be used for taking a dot product of the reference water/fat relationship graph and the current water/fat relationship graph, and if the dot product result is negative, configured to determine that the reference water/fat relationship graph and the current water/fat relationship graph have different patterns, and if the dot product result is not negative, configured to determine that the reference water/fat relationship graph and the current water/fat relationship graph have the same pattern;
the peak value relationship determination module is configured to be used for judging whether the positional relationship of the relatively highest peak and relatively lowest trough in the reference water/fat relationship graph is the same as the positional relationship of the relatively highest peak and relatively lowest trough in the current water/fat relationship graph, and if it is, determining that the reference water/fat relationship graph and the current water/fat relationship graph have the same pattern, and if it is not, determining that the reference water/fat relationship graph and the current water/fat relationship graph have different patterns.

15. An MRI water/fat image identification device, comprising:

a processor configured to:
use, via an image mask generation module, a grayscale histogram obtained for an in-phase image corresponding to a water/fat image pair calculated by a Dixon method to determine an image mask, wherein the water/fat image pair is formed by a first image and a second image;
subject, via an image segmentation module, the image mask to image segmentation to obtain a region image mask corresponding to each anatomical region;
select, via a reference region selection module, one of the region image masks as a reference region image mask;
select, via a current region selection module, a region image mask from unprocessed region image masks as a current region image mask, in the case where there are unprocessed region image masks;
use, via a foreground image extraction module, the reference region image mask to extract a first reference foreground image from the first image and a second reference foreground image from the second image and configured to use the current region image mask to extract a first current foreground image from the first image and a second current foreground image from the second image;
calculate, via a second histogram calculation module, grayscale histograms for the first reference foreground image and the second reference foreground image, respectively, to obtain a first reference grayscale histogram and a second reference grayscale histogram, and configured to calculate grayscale histograms for the first current foreground image and the second current foreground image, respectively, to obtain a first current grayscale histogram and a second current grayscale histogram;
subtract, via a second relationship curve calculation module, the second reference grayscale histogram from the first reference grayscale histogram, to obtain a reference water/fat relationship graph, and configured to subtract the second current grayscale histogram from the first current grayscale histogram, to obtain a current water/fat relationship graph;
compare, via curve pattern comparison module, the reference water/fat relationship graph with the current water/fat relationship graph to determine whether they have the same pattern characteristics, and obtain a comparison result;
replace, via a harmonization processing module, the first current foreground image and the second current foreground image in the case where the comparison result indicates that the reference water/fat relationship graph and the current water/fat relationship graph have different pattern characteristics and, in the case where the comparison result does not indicate that the reference water/fat relationship graph and the current water/fat relationship graph have different pattern characteristics, configured to keep the positions of the first current foreground image and the second current foreground image unchanged; and
search, via an image type determination module, the relatively highest peak and relatively lowest trough in the reference water/fat relationship graph obtained by the second relationship curve calculation module once the harmonization processing module has completed harmonization processing of the first image and the second image, judging the positional relationship of the relatively highest peak and relatively lowest trough in the reference water/fat relationship graph, and if the relatively highest peak is located behind the relatively lowest trough, configured to determine the first image as being a water image and the second image as being a fat image, and if the relatively highest peak is not located behind the relatively lowest trough, configured to determine the second image as being a water image and the first image as being a fat image.

16. An MRI water/fat image harmonization device, comprising:

a processor configured to:

use, via an image mask generation module, a grayscale histogram obtained for an in-phase image corresponding to a water/fat image pair calculated by a Dixon method to determine an image mask, wherein the water/fat image pair is formed by a first image and a second image;

subject, via an image segmentation module, the image mask to image segmentation to obtain a region image mask corresponding to each anatomical region;

select, via a reference region selection module, one of the region image masks as a reference region image mask;

select, via a current region selection module, a region image mask from unprocessed region image masks as a current region image mask, in the case where there are unprocessed region image masks;

use, via a foreground image extraction module, the reference region image mask to extract a first reference foreground image from the first image and a second reference foreground image from the second image, and configured to use the current region image mask to extract a first current foreground image from the first image and a second current foreground image from the second image;

calculate, via a second histogram calculation module, grayscale histograms for the first reference foreground image and the second reference foreground image, respectively, to obtain a first reference grayscale histogram and a second reference grayscale histogram, and configured to calculate grayscale histograms for the first current foreground image and the second current foreground image, respectively, to obtain a first current grayscale histogram and a second current grayscale histogram;

subtract, via a second relationship curve calculation module, the second reference grayscale histogram from the first reference grayscale histogram, to obtain a reference water/fat relationship graph, and configured to subtract the second current grayscale histogram from the first current grayscale histogram, to obtain a current water/fat relationship graph;

compare, via a curve pattern comparison module, the reference water/fat relationship graph with the current water/fat relationship graph to determine whether they have the same pattern characteristics, and configured to obtain a comparison result; and subject, via a harmonization processing module, the first current foreground image and the second current foreground image to position replacement in the first image and the second image in the case where the comparison result indicates that the reference water/fat relationship graph and the current water/fat relationship graph have different pattern characteristics and, in the case where the comparison result does not indicate that the reference water/fat relationship graph and the current water/fat relationship graph have different pattern characteristics otherwise, configured to keep the positions of the first current foreground image and the second current foreground image in the first image and the second image unchanged.

* * * * *